US012183588B2

(12) United States Patent
Sun et al.

(10) Patent No.: US 12,183,588 B2
(45) Date of Patent: Dec. 31, 2024

(54) WET ETCHING METHOD

(71) Applicants: Semiconductor Manufacturing International (Shanghai) Corporation, Shanghai (CN); Semiconductor Manufacturing International (Beijing) Corporation, Beijing (CN)

(72) Inventors: Tianyang Sun, Shanghai (CN); Qiao Yu, Shanghai (CN); Xiaoshan Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 576 days.

(21) Appl. No.: 17/453,485

(22) Filed: Nov. 3, 2021

(65) Prior Publication Data
US 2022/0139723 A1 May 5, 2022

(30) Foreign Application Priority Data
Nov. 4, 2020 (CN) .......................... 202011219380.X

(51) Int. Cl.
*H01L 21/3213* (2006.01)
*C09K 13/00* (2006.01)
(Continued)

(52) U.S. Cl.
CPC ........ *H01L 21/32134* (2013.01); *C09K 13/00* (2013.01); *C09K 13/04* (2013.01); *C09K 13/08* (2013.01)

(58) Field of Classification Search
CPC ................... H01L 21/32134; H01L 21/02019
See application file for complete search history.

(56) References Cited

U.S. PATENT DOCUMENTS

2001/0054706 A1* 12/2001 Levert ...................... C23F 3/00
257/E21.309
2010/0124823 A1* 5/2010 Yeh .................. H01L 21/82385
257/E21.536
(Continued)

FOREIGN PATENT DOCUMENTS

WO    WO-2020195081 A1 * 10/2020 ......... H01L 21/0206

OTHER PUBLICATIONS

Machine language translation of WO 2020/195081 A1 (Year: 2020).*

*Primary Examiner* — Erik Kielin
(74) *Attorney, Agent, or Firm* — Anova Law Group, PLLC

(57) ABSTRACT

A wet etching method is provided in the present disclosure. The method includes providing a substrate, where a layer to-be-etched is on a surface of the substrate; and performing etching treatments on the layer to-be-etched till a thickness of the layer to-be-etched reaches a target thickness. Each etching treatment includes performing a first etching process, where the substrate is at a first rotation speed; after the first etching process, performing a second etching process, where a rotation speed of the substrate is reduced from the first rotation speed to a second rotation speed, and a liquid film of a chemical solution on the surface of the substrate is increased to a first thickness; and after the second etching process, performing a third etching process, where the substrate is at a third rotation speed, and the third rotation speed is lower than or equal to the first rotation speed.

14 Claims, 5 Drawing Sheets

(51) Int. Cl.
*C09K 13/04* (2006.01)
*C09K 13/08* (2006.01)

(56) References Cited

U.S. PATENT DOCUMENTS

2018/0182645 A1* 6/2018 Nakano ............. H01L 21/67051
2021/0098271 A1* 4/2021 Kamimura ............ B08B 7/0014

* cited by examiner

WET ETCHING METHOD

CROSS-REFERENCE TO RELATED APPLICATION

This application claims the priority of Chinese Patent Application No. 202011219380.X, filed on Nov. 4, 2020, the content of which is incorporated herein by reference in its entirety.

TECHNICAL FIELD

The present disclosure generally relates to the field of semiconductor manufacturing and, more particularly, relates to a wet etching method.

BACKGROUND

With the development of semiconductor technology, line widths continue to be reduced, and etching requirements are continuously increased. Compared with a dry etching process, a wet etching process with relatively low surface damage has been applied extensively in integrated circuit (IC) manufacturing.

The wet etching process uses an etching solution to etch a wafer. The wet etching process may be a batch wet etching process or a monolithic wet etching process. Compared with the batch wet etching technology, the monolithic wet etching technology can reduce cross-contamination risk during a cleaning process, and has flexible process adjustment capability, which has become an important technology in the wet etching process.

However, the existing monolithic wafer wet etching process is difficult to meet device requirements for flatness and no corrosion pits, so that the wet etching technology needs to be further improved.

SUMMARY

One aspect of the present disclosure provides a wet etching method. The method includes providing a substrate, where a layer to-be-etched is on a surface of the substrate; and performing a plurality of etching treatments on the layer to-be-etched till a thickness of the layer to-be-etched reaches a target thickness. Each etching treatment includes performing a first etching process, where, in the first etching process, the substrate is at a first rotation speed; after the first etching process, performing a second etching process, where, in the second etching process, a rotation speed of the substrate is reduced from the first rotation speed to a second rotation speed, and a liquid film of a chemical solution on the surface of the substrate is increased to a first thickness; and after the second etching process, performing a third etching process, where the substrate is at a third rotation speed, and the third rotation speed is lower than or equal to the first rotation speed.

Optionally, the chemical solution contains an inorganic acid including hydrofluoric acid, hydrochloric acid, phosphoric acid, or a combination thereof.

Optionally, the chemical solution contains an organic acid including acetic acid, oxalic acid, or a combination thereof.

Optionally, the chemical solution includes a deionized water solution with introduced carbon dioxide.

Optionally, the first etching process includes a flow rate of the chemical solution ranged from about 0.5 liters per minute to about 2.5 liters per minute, an etching time ranged from about 0 second to about 60 seconds, and the first rotation speed ranged from about 100 revolutions per minute to about 500 revolutions per minute.

Optionally, the second etching process includes a flow rate of the chemical solution ranged from about 0.5 liters per minute to about 2.5 liters per minute, and the second rotation speed ranged from about 10 revolutions per minute to about 100 revolutions per minute.

Optionally, the third etching process includes a flow rate of the chemical solution ranged from about 0 liter per minute to about 0.5 liter per minute, and the third rotation speed ranged from about 10 revolutions per minute to about 100 revolutions per minute.

Optionally, in the second etching process, a unit time period is provided, and the rotation speed of the substrate reduces 100 revolutions per minute in the unit time period.

Optionally, the unit time period ranges from about 0.1 second to about 3 seconds.

Optionally, the layer to-be-etched is made of a metal including cobalt, aluminum, copper, titanium/aluminum alloy, or a combination thereof.

Optionally, a number of the etching treatments ranges from about 1 to about 20.

Optionally, the first thickness is greater than 0.3 mm.

Compared with the existing technology, the technical solutions provided by the present disclosure may achieve at least the following beneficial effects.

The technical solutions of the present disclosure provide the method for forming the semiconductor structure. The plurality of etching treatments may be performed on the layer to-be-etched until the thickness of the layer to-be-etched reaches the target thickness; and each etching treatment may include three etching processes. In the first etching process, the chemical solution may be evenly distributed on the surface of the substrate by lowering the first rotation speed; and the etching amount of the layer to-be-etched in the first etching process may be minimized by shortening the time of the first etching process. In the second etching process, the second rotation speed may be lower than the first rotation speed; at the relative low rotation speed, the chemical solution on the edge of the substrate surface may not be removed under the action of centrifugal force. Therefore, the uniformity of the liquid film of the chemical solution may be improved in the first and second etching processes; meanwhile, the liquid film of the chemical solution on the surface of the substrate may be easily accumulated, and the thickness of the liquid film of the chemical solution may be sufficiently thick, thereby reducing the chance of oxygen in the air entering the surface of the layer to-be-etched and inhibiting the oxidation of the material of the layer to-be-etched. After the second etching process, the third etching process may be used to etch the layer to-be-etched. Relative thick and uniform liquid film of the chemical solution may be obtained in the first and second etching processes, which may facilitate uniform etching, improve the surface flatness of the layer to-be-etched, and reduce the probability of corrosion pit defects.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference may be made in detail to exemplary embodiments of the present disclosure hereinafter, which are illustrated in accompanying drawings. Wherever possible, same reference numbers may be used throughout the accompanying drawings to refer to same or like parts.

As described in the background, the existing monolithic wafer wet etching technology needs to be improved. A monolithic wafer wet etching technology may be used for description and analysis.

A wet etching method is provided in the present disclosure. The method includes providing a substrate, where a layer to-be-etched is on a surface of the substrate; and performing etching treatments on the layer to-be-etched till a thickness of the layer to-be-etched reaches a target thickness. Each etching treatment includes performing a first etching process, where the substrate is at a first rotation speed; after the first etching process, performing a second etching process, where a rotation speed of the substrate is reduced from the first rotation speed to a second rotation speed, and a liquid film of a chemical solution on the surface of the substrate is increased to a first thickness; and after the second etching process, performing a third etching process, where the substrate is at a third rotation speed, and the third rotation speed is lower than or equal to the first rotation speed.

Figure 1:
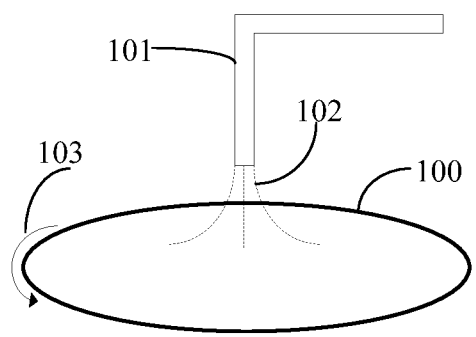
FIG. 1 illustrates a schematic of an exemplary wet etching method.

FIG. 1 illustrates a schematic of an exemplary wet etching method.

Referring to FIG. 1, a wafer 100 may be provided, where a nozzle 101 may be above the wafer 100; a chemical solution 102 may be sprayed onto the surface of the wafer 100 from the nozzle 101; the wafer 100 may rotate along an arc 103 at a speed of 800 revolutions per minute; and the wafer 100 may be etched until a target etching amount is reached.

The above-mentioned method may be used in material etching or cleaning processes. When the wafer 100 is rotating, the surface of the wafer 100 may be etched. The chemical solution may be constantly replenished in the middle position of the wafer 100, and the liquid film of the chemical solution on the wafer 100 may be evenly distributed using a relative high rotation speed, such that the surface of the wafer 100 may be relatively uniformly etched. However, at the relative high rotation speed, the chemical solution on the edge of the wafer 100 may be removed under the action of centrifugal force, and the chemical solution may be constantly replenished in the middle position of the wafer 100; therefore, the thickness of the chemical solution on the edge of the wafer 100 may be thinner than the thickness of the chemical solution in the middle position of the wafer 100, and oxygen in the air may be easily dissolved into the chemical solution on the surface of the edge of the wafer 100. When the etched material on the surface of the wafer 100 is a metal material that can be easily oxidized, such as cobalt, aluminum, copper, and the like, more etched material at the edge of the wafer 100 may be removed because the metal material is easily etched and removed after oxidation, which may result in poor surface flatness of the wafer 100. Furthermore, uneven etching caused by the metal oxidation may also cause corrosion pit defects, thereby affecting the surface quality of the polished metal material.

As the device size is at the nanometer level, the process of semiconductor technology becomes more refined, and achieving overall area scaling of the chip has become an industry goal. For example, Intel develops the contact-over-active-gate (COAG) technology for fin field-effect transistors (FinFETs), and the new device structures also bring challenges to the manufacturing process. The COAG technology needs to back etch metal gates. Since the feature size of the device is extremely small, extremely high etching flatness without damage may be needed.

In order to solve the above-mentioned technical problems, the technical solutions of the present disclosure provide a wet etching method. A plurality of etching treatments may be performed on a layer to-be-etched until the thickness of the layer to-be-etched reaches a target thickness. Each etching treatment may include three etching processes. In the first etching process, the chemical solution may be evenly distributed on the surface of the substrate by lowering the first rotation speed; and the etching amount of the layer to-be-etched in the first etching process may be minimized by shortening the time of the first etching process. In the second etching process, the second rotation speed may be lower than the first rotation speed; at the relative low rotation speed, the chemical solution on the edge of the substrate surface may not be removed under the action of centrifugal force. Therefore, the uniformity of the liquid film of the chemical solution may be improved in the first and second etching processes. Meanwhile, the liquid film of the chemical solution on the surface of the substrate may be easily accumulated, and the thickness of the liquid film of the chemical solution may be sufficiently thick, thereby reducing the chance of oxygen in the air entering the surface of the layer to-b e-etched and inhibiting the oxidation of the material of the layer to-be-etched. After the second etching process, the third etching process may be used to etch the layer to-be-etched. Relative thick and uniform liquid film of the chemical solution may be obtained in the first and second etching processes, which may facilitate uniform etching, improve the surface flatness of the layer to-be-etched, and reduce the probability of corrosion pit defects.

In order to clearly illustrate the above-mentioned objectives, features, and advantages of the present disclosure, various embodiments of the present disclosure are described in detail with reference to the accompanying drawings hereinafter.

Figure 2:
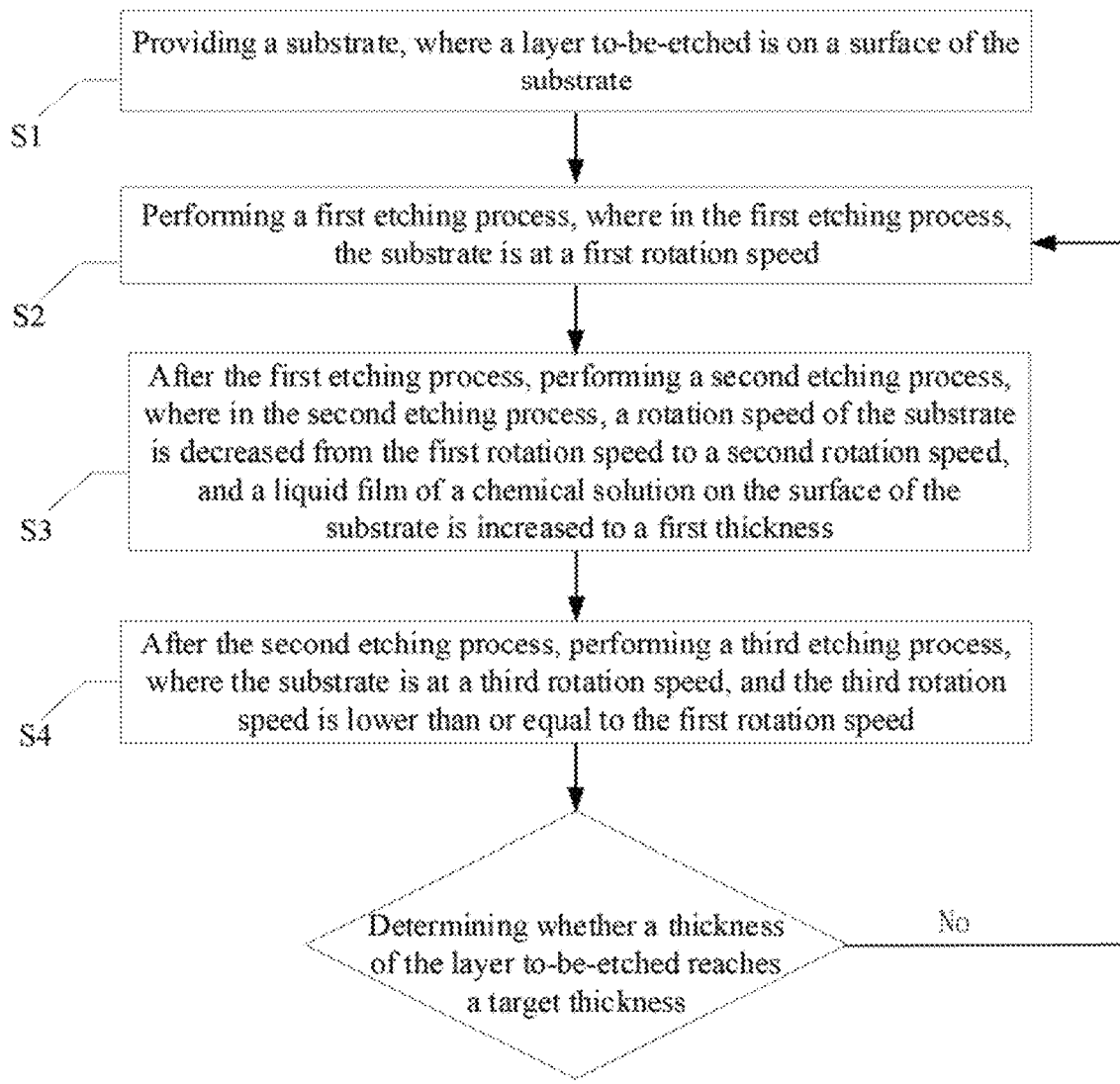
FIG. 2 illustrates a flowchart corresponding to certain stages of a wet etching method according to various disclosed embodiments of the present disclosure.

FIG. 2 illustrates a flowchart corresponding to certain stages of a wet etching method according to various disclosed embodiments of the present disclosure.

In S1, a substrate may be provided, where a layer to-be-etched may be on the surface of the substrate.

In S2, the first etching process may be performed. In the first etching process, the substrate may have the first rotation speed.

In S3, after the first etching process, the second etching process may be performed. In the second etching process, the rotation speed of the substrate may be decreased from the first rotation speed to the second rotation speed, and the liquid film of the chemical solution on the surface of the substrate may be increased to the first thickness.

In S4, after the second etching process, the third etching process may be performed. The substrate may have the third rotation speed, and the third rotation speed may be lower than or equal to the first rotation speed.

Whether the thickness of the layer to-be-etched reaches a target thickness may be determined. If the target thickness is reached, the etching treatment may be terminated. If the target thickness is not reached, S2 to S4 may be repeated.

The wet etching method is described in detail below with reference to the accompanying drawings.

FIGS. 3-9 illustrate structural schematics corresponding to certain stages of a method for forming an exemplary semiconductor structure according to various disclosed embodiments of the present disclosure.

Figure 3:
FIGS. 3-9 illustrate structural schematics corresponding to certain stages of a method for forming an exemplary semiconductor structure according to various disclosed embodiments of the present disclosure.

Referring to FIG. 3, a substrate 200 may be provided, and the surface of the substrate 200 may have a layer to-be-etched 201.

The layer to-be-etched 201 may be made of a metal including cobalt, aluminum, copper, titanium aluminum (TiAl)-based alloy, and/or any other suitable material(s). The layer to-be-etched 201 may be easily oxidized, and corrosion pit defects may be easily formed during the etching process, which may affect the surface quality of the layer to-be-etched 201 after etching. A method for reducing the occurrence probability of the corrosion pit defects may be subsequently provided. In one embodiment, the layer to-be-etched 201 may be made of cobalt.

The substrate 200 may be made of a semiconductor material or any material that can support the layer to-be-etched 201, such as metal and the like. The substrate 200 may be a single-layer structure; and the substrate 200 may be a composite structure. For example, a device (e.g., a transistor) may be formed in the substrate. In one embodiment, the substrate 200 may be a silicon wafer and contain transistor devices (not shown).

Subsequently, a plurality of etching treatments may be performed on the layer to-be-etched 201 until the thickness of the layer to-be-etched 201 reaches the target thickness. Each etching treatment may refer to FIGS. 4-8.

Figure 4:
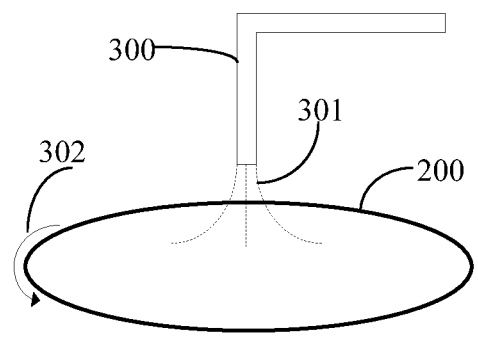
Figure 5:
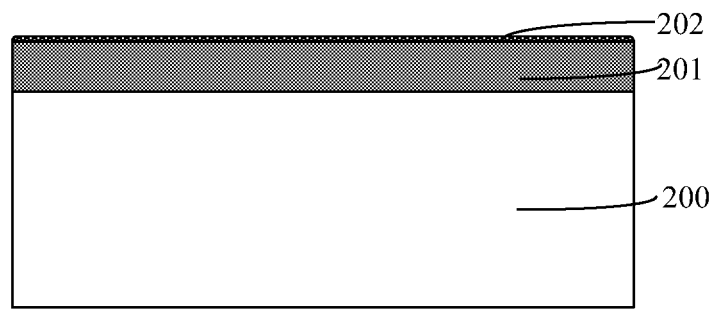

Referring to FIGS. 4-5, FIG. 4 illustrates the wet etching method, and FIG. 5 illustrates a cross-sectional view of the semiconductor structure. The first etching process may be performed; and in the first etching process, the substrate 200 may have the first rotation speed 302.

In one embodiment, the chemical solution 301 may be sprayed from a nozzle 300 to the surface of the substrate 200, and the liquid film of the chemical solution 202 may be continuously accumulated on the surface of the layer to-be-etched 201.

The parameters of the first etching process may include the flow rate of the chemical solution ranged from about 0.5 liter per minute to about 2.5 liters per minute, the etching time ranged from about 0 second to about 60 seconds, and the first rotation speed 302 ranged from about 100 revolutions per minute to about 500 revolutions per minute. In the first etching process, the first rotation speed 302 may be relative low, such that the chemical solution on the edge of the substrate 200 may not be easily removed under the action of centrifugal force, which may improve the uniformity from the edge of the substrate 200 to the middle position of the substrate 200.

Since the first etching time is relatively short, the etching amount of the layer to-be-etched in the first etching process may be extremely small. In one embodiment, the first etching time may be about 30 seconds; and the first rotation speed 302 may be about 250 revolutions per minute.

Figure 6:
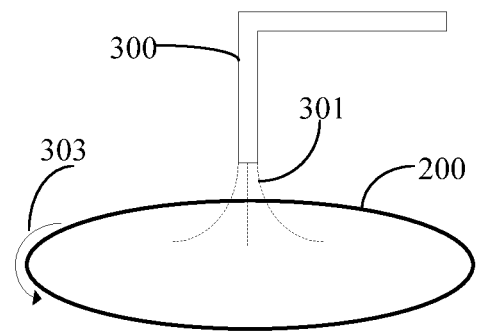
Figure 7:
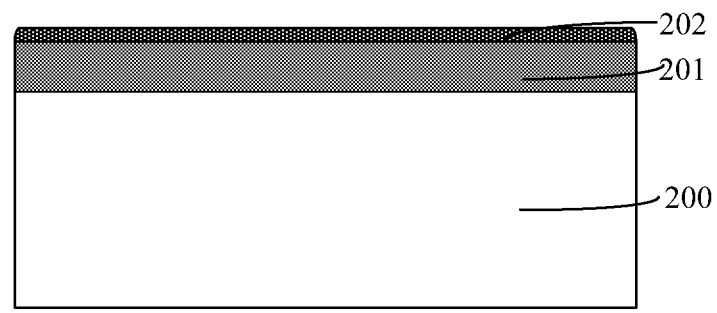

Referring to FIGS. 6-7, after the first etching process, the second etching process may be performed. In the second etching process, the rotation speed of the substrate 200 may be decreased from the first rotation speed 302 to the second rotation speed 303, and the liquid film of the chemical solution 202 on the surface of the substrate 200 may be increased to the first thickness.

The parameters of the second etching process may include the flow rate of the chemical solution ranged from about 0.5 liter per minute to about 2.5 liters per minute, and the second rotation speed 303 ranged from about 10 revolutions per minute to about 100 revolutions per minute.

In the second etching process, a unit time period may be provided, and the rotation speed of the substrate 200 may be reduced by 100 revolutions per minute in the unit time period.

The unit time period may range from about 0.1 second to about 3 seconds.

In one embodiment, the second rotation speed 303 may be 50 revolutions per minute; and the unit time period may be about 1 second. That is, the rotation speed of the substrate 200 may be reduced by 100 revolutions per minute for every 1 second, the first rotation speed 302 may be reduced to the second rotation speed 303 in two steps, and the total time may be about 2 seconds. In other embodiments, the reduction from the first rotation speed 302 to the second rotation speed 303 may be completed in one or more steps.

The first thickness may be greater than 0.3 mm. In the second etching process, the second rotation speed 303 may be lower than the first rotation speed 302; at the relative low rotation speed, the chemical solution on the edge of the substrate surface may not be removed under the action of centrifugal force. Therefore, the uniformity of the liquid film of the chemical solution 202 may be improved in the first and second etching processes; meanwhile, the liquid film of the chemical solution 202 on the surface of the substrate may be easily accumulated, and the thickness of the liquid film of the chemical solution may be sufficiently thick, thereby reducing the chance of oxygen in the air entering the surface of the layer to-be-etched 201 and inhibiting the oxidation of the material of the layer to-be-etched.

The chemical solution may contain an inorganic acid; and the inorganic acid may include hydrofluoric acid, hydrochloric acid, phosphoric acid, or a combination thereof The chemical solution may contain an organic acid; and the organic acid may include acetic acid or oxalic acid.

The chemical solution may contain an organic acid or an inorganic acid that easily reacts with the layer to-be-etched 201, which may not be limited to the common etching solutions listed above. In one embodiment, the chemical solution may be a nitric acid solution, and the volume ratio of $H_2O:HNO_3$ in the nitric acid solution may be about 1:1. Common corrosive solution may be used in the existing etching equipment without need of adding new equipment, which may be beneficial for operation. In other embodiments, according to different materials of the layer to-be-etched, different etching solutions and ratios may be selected. Different etching solutions and ratios may be selected according to the materials of the layer to-be-etched to slightly etch the layer to-be-etched, that is, the effect of cleaning the layer to-be-etched may be achieved.

The chemical solution may include a deionized water solution in which carbon dioxide is introduced. Deionized water containing carbon dioxide may be used to clean the layer to-be-etched 201 non-destructively and to remove residues on the surface of the layer to-be-etched 201.

Figure 8:
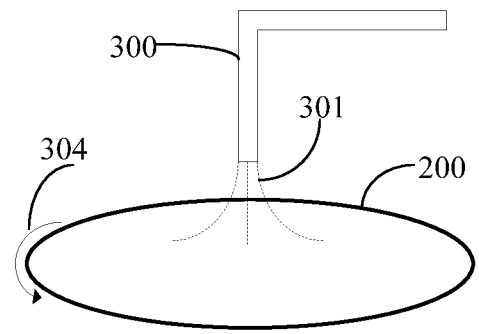

Referring FIG. 8, after the second etching process, the third etching process may be performed. The substrate may have the third rotation speed 304; and the third rotation speed 304 may not be higher than the first rotation speed 302.

The parameters of the third etching process may include the flow rate of the chemical solution ranged from about 0 liter per minute to about 0.5 liter per minute, and the third rotation speed 304 ranged from about 10 revolutions per minute to about 100 revolutions per minute. In the third etching process, a relatively low flow rate of the chemical solution and a relatively low rotation speed may be used. Therefore, the chemical solution on the edge of the substrate 200 may not be easily removed under the action of centrifugal force, which may improve the uniformity from the edge of the substrate 200 to the middle position of the substrate 200. Relative thick and uniform liquid film of the chemical solution may be obtained in the first and second etching processes, which may facilitate uniform etching, improve the surface flatness of the layer to-be-etched, and reduce the probability of corrosion pit defects.

Figure 9:
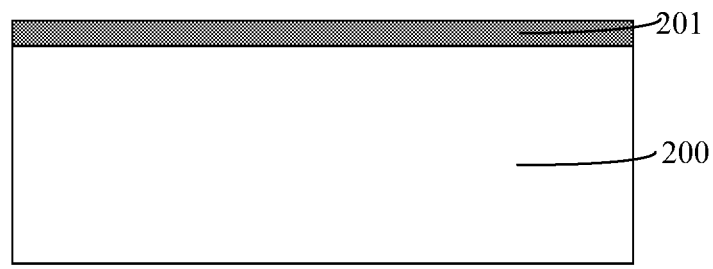

Referring to FIG. 9, a plurality of etching treatments may be performed on the layer to-be-etched 201 until the thickness of the layer to-be-etched reaches the target thickness.

After the third etching process, whether the thickness of the layer to-be-etched 201 reaches the target thickness may be determined. If the target thickness is not reached, the first etching process to the third etching process may be repeated until the thickness of the layer to-be-etched 201 reaches the target thickness value. After the thickness of the layer to-be-etched 201 reaches the target thickness value, the surface of the layer to-be-etched 201 with high flatness and low corrosion pit defects may be easily formed after the subsequent conventional rinsing and drying treatments.

The number of etching treatments may range from 1 time to 20 times. The number of etching treatments may depend on the material of the layer to-be-etched, the etching target, etching parameter selection such as the type and flow rate of the chemical solution, and the like.

Although the present disclosure has been disclosed above, the present disclosure may not be limited thereto. Any changes and modifications may be made by those skilled in the art without departing from the spirit and scope of the present disclosure, and the scope of the present disclosure should be determined by the scope defined by the appended claims.

What is claimed is:

1. A wet etching method, comprising:
providing a substrate, wherein a layer to-be-etched is on a surface of the substrate; and
performing a plurality of etching treatments on the layer to-be-etched till a thickness of the layer to-be-etched reaches a target thickness, wherein each etching treatment includes:
performing a first etching process, wherein in the first etching process, the substrate is at a first rotation speed;
after the first etching process, performing a second etching process, wherein in the second etching process, a rotation speed of the substrate is reduced from the first rotation speed to a second rotation speed, and a liquid film of a chemical solution on the surface of the substrate is increased to a first thickness; and
after the second etching process, performing a third etching process, wherein the substrate is at a third rotation speed, the third rotation speed is lower than or equal to the first rotation speed, and a flow rate of the chemical solution in the third etching process is greater than 0, less than a flow rate of the chemical solution in the first etching process, and less than a flow rate of the chemical solution in the second etching process.

2. The method according to claim 1, wherein:
the chemical solution contains an inorganic acid including hydrofluoric acid, hydrochloric acid, phosphoric acid, or a combination thereof.

3. The method according to claim 1, wherein:
the chemical solution contains an organic acid including acetic acid, oxalic acid, or a combination thereof.

4. The method according to claim 1, wherein:
the chemical solution includes a deionized water solution with introduced carbon dioxide.

5. The method according to claim 1, wherein:
the flow rate of the chemical solution in the first etching process ranges from about 0.5 liters per minute to about 2.5 liters per minute, an etching time ranged from about 0 second to about 60 seconds, and the first rotation speed ranged from about 100 revolutions per minute to about 500 revolutions per minute.

6. The method according to claim 1, wherein:
the flow rate of the chemical solution in the second etching process ranges ranged from about 0.5 liters per minute to about 2.5 liters per minute, and the second rotation speed ranged from about 10 revolutions per minute to about 100 revolutions per minute.

7. The method according to claim 1, wherein:
the flow rate of the chemical solution in the third etching process is smaller than or equal to 0.5 liter per minute, and the third rotation speed ranged from about 10 revolutions per minute to about 100 revolutions per minute.

8. The method according to claim 1, wherein:
in the second etching process, a unit time period is provided, and the rotation speed of the substrate is reduced by 100 revolutions per minute in the unit time period.

9. The method according to claim 8, wherein:
the unit time period ranges from about 0.1 second to about 3 seconds.

10. The method according to claim 1, wherein:
the layer to-be-etched is made of a metal including cobalt, aluminum, copper, titanium/aluminum alloy, or a combination thereof.

11. The method according to claim 1, wherein:
a number of the plurality of etching treatments ranges from 2 to 20.

12. The method according to claim 1, wherein:
the first thickness is greater than 0.3 mm.

13. A wet etching method, comprising:
providing a substrate, wherein a layer to-be-etched is on a surface of the substrate; and
performing a plurality of etching treatments on the layer to-be-etched till a thickness of the layer to-be-etched reaches a target thickness, wherein each etching treatment includes:
performing a first etching process, wherein in the first etching process, the substrate is at a first rotation speed;
after the first etching process, performing a second etching process, wherein in the second etching process, a rotation speed of the substrate is reduced from the first rotation speed to a second rotation speed, a liquid film of a chemical solution on the surface of the substrate is increased to a first thickness, and the chemical solution contains an organic acid including acetic acid, oxalic acid, or a combination thereof; and after the second etching process, performing a third etching process, wherein the substrate is at a third rotation speed, and the third rotation speed is lower than or equal to the first rotation speed.

14. A wet etching method, comprising:

providing a substrate, wherein a layer to-be-etched is on a surface of the substrate; and performing a plurality of etching treatments on the layer to-be-etched till a thickness of the layer to-be-etched reaches a target thickness, wherein each etching treatment includes:

performing a first etching process, wherein in the first etching process, the substrate is at a first rotation speed;

after the first etching process, performing a second etching process, wherein in the second etching process, a rotation speed of the substrate is reduced from the first rotation speed to a second rotation speed, a liquid film of a chemical solution on the surface of the substrate is increased to a first thickness, and in the second etching process, a unit time period is provided, and the rotation speed of the substrate is reduced by 100 revolutions per minute in the unit time period; and after the second etching process, performing a third etching process, wherein the substrate is at a third rotation speed, and the third rotation speed is lower than or equal to the first rotation speed.

\* \* \* \* \*